(12) United States Patent
Tai et al.

(10) Patent No.: US 6,585,826 B2
(45) Date of Patent: Jul. 1, 2003

(54) SEMICONDUCTOR WAFER CLEANING METHOD TO REMOVE RESIDUAL CONTAMINATION INCLUDING METAL NITRIDE PARTICLES

(75) Inventors: Yali Tai, Taoyuan (TW); Shih-Chi Lin, Taipei (TW); Wen-Long Lee, Taipei (TW); Francis Wang, Taipei (TW); Szu-An Wu, Hsin-Chu (TW); Hsi-Kuei Cheng, Hsin-chu (TW); Ying-Lang Wang, Tai-chung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 34 days.

(21) Appl. No.: 10/000,891

(22) Filed: Nov. 2, 2001

(65) Prior Publication Data

US 2003/0084919 A1 May 8, 2003

(51) Int. Cl.$^7$ .................................. C23G 1/02
(52) U.S. Cl. .................. 134/3; 134/1; 134/1.2; 134/6; 134/19; 134/26; 134/28; 134/30; 134/34; 134/35; 134/36; 134/41; 134/902; 15/77; 15/88.2; 15/88.3; 510/175; 510/477; 510/488

(58) Field of Search .................. 134/1, 1.2, 3, 6, 134/19, 26, 28, 30, 34, 35, 36, 41, 902; 15/77, 88.2, 88.3; 510/175, 477, 488

(56) References Cited

U.S. PATENT DOCUMENTS

| | | | | |
|---|---|---|---|---|
| 5,679,169 A | * | 10/1997 | Gonzales et al. | 134/1.3 |
| 5,762,084 A | * | 6/1998 | Krusell et al. | 134/184 |
| 5,944,906 A | * | 8/1999 | Robinson | 134/1.3 |
| 5,968,280 A | * | 10/1999 | Ronay | 134/2 |
| 5,972,124 A | * | 10/1999 | Sethuraman et al. | 134/7 |
| 6,147,002 A | * | 11/2000 | Kneer | 438/692 |
| 6,269,511 B1 | * | 8/2001 | Andreas et al. | 15/77 |
| 6,274,059 B1 | * | 8/2001 | Krusell et al. | 216/88 |

* cited by examiner

Primary Examiner—Sharidan Carrillo
(74) Attorney, Agent, or Firm—Tung & Associates

(57) ABSTRACT

A method of removing residual contamination including metal nitride particles from semiconductor wafer surfaces including the steps of: providing at least one semiconductor wafer with metal nitride particles adhering to the at least one semiconductor wafer surface thereto; subjecting the at least one semiconductor wafer to at least one mechanical brushing process while a cleaning solution including a carboxylic acid is supplied to at least one semiconductor wafer surface; and, subjecting the at least one semiconductor wafer to an a sonic cleaning process including the carboxylic acid cleaning solution.

7 Claims, 2 Drawing Sheets

SEMICONDUCTOR WAFER CLEANING METHOD TO REMOVE RESIDUAL CONTAMINATION INCLUDING METAL NITRIDE PARTICLES

FIELD OF THE INVENTION

This invention generally relates to semiconductor wafer cleaning and more particularly to a cleaning procedure for removing residual contamination from semiconductor wafer surface including metal nitride particles, following semiconductor device manufacturing processes.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

For example, in creating a multiple layer semiconductor device on a semiconductor wafer, each layer making up the device may be subjected to one or more deposition processes, for example by chemical vapor deposition (CVD), and usually including one or more etching procedures by either a dry (plasma) or wet (chemical) etching process. A critical condition in semiconductor manufacturing is the absence of contaminants on the wafer processing surface, as contaminants including, for example, microscopic particles, may interfere with and adversely affect subsequent processing steps leading to device degradation and ultimately semiconductor wafer rejection.

While the wafer cleaning process has been always been a critical step in the semiconductor wafer manufacturing process, ultra clean wafers are becoming even more critical to device integrity. For example, as semiconductor feature sizes decrease, the detrimental affect of particle contamination increases, requiring removal of ever smaller particles. For example, particles as small as 20 nm may be unacceptable in many semiconductor manufacturing processes. Further, as the number of device layers increase there is a corresponding increase in the number of cleaning steps and the potential for device degradation caused by contamination. To adequately meet requirements for ultra clean wafers in ULSI and VLSI the wafer surface must be free of particles, organic contamination, metal contamination, surface micro roughness and native oxide.

Common processes in use for cleaning wafers include cleaning solutions based on hydrogen peroxide. At high pH values (basic) organic contamination and oxidizable particles, are removed by an oxidation process. At low pH (acidic) metal contamination is desorbed from the wafer surface by forming a soluble complex.

Common particle removal mechanisms which may be exploited, depending on the particle and how it adheres to the surface, include dissolution, oxidizing degradation and dissolution, physical removal by etching, and electrical repulsion between a particle and the wafer surface.

Standard wafer cleaning processes include mechanical scrubbing or and ultrasonic agitation of the wafer surface in the cleaning solution or in deionized water (particulate removal). Typical chemical cleaning solutions include solutions of "piranha", RCA cleanup, and choline. Piranha is a solution of hydrogen peroxide ($H_2O_2$) and sulfuric acid ($H_2SO_4$). Choline cleaning solution includes hydrogen peroxide with choline (($CH_3)_3$ $N(CH_2CH_2OH)OH$) at 50° C. followed by an ultrasonic agitation in deionized water and a deionized water rinse followed by a spin dry. The RCA cleaning process has up to three steps; a removal of gross organics with perchloroethylene; a removal of residual organic films with a basic solution of $H_2O_2$ and $NH_4OH$ followed by deionized water rinse and spin dry; and, a removal of metal particles with an acidic solution of $H_2O_2$ and HCl again followed a deionized water rinse and spin dry. The cleaning solutions are typically used at about 75° C. to about 80° C. and essentially provide an oxidizing and complexing treatment which does not attack silicon or silicon dioxide (oxide). The basic solution cleanup is frequently referred to as SC-1 and the acidic solution cleanup is referred to as SC-2.

One shortcoming with cleaning process of the prior art using cleaning solutions based on hydrogen peroxide, is the failure to adequately remove metal nitride particles as acceptable particle sizes decrease. Metal nitrides are used in semiconductor processing for numerous portions of a semiconductor device. For example, metal nitrides including silicon nitride, silicon oxynitride, and titanium nitride are widely used as barrier layers in metal interconnects such as vias and trench lines to prevent metal fill diffusion into adjacent insulating layers.

Another example includes the use of metal nitrides, for example, silicon nitride, as a hard mask or etch stop overlying, for example, an insulating layer in which features are anisotropically etched using the metal nitride as a hard mask during reactive ion etching (RIE). The metal nitride layers are typically deposited by a CVD process such as plasma enhanced CVD (PECVD) and low pressure CVD (LPCVD). Metal nitride particles contaminate the process wafer surface during both the CVD process and the RIE process. For example, metal nitride particles remaining on the wafer surface after the CVD process may degrade subsequent process steps including photolithographic patterning of a photoresist layer deposited over a metal nitride layer in preparation for etching. As a further example, metal nitride particles remaining over a barrier layer following a CVD deposition could interfere with the adhesion or step coverage of, for example, a metal seed layer for a subsequent electrodeposition process.

Yet another example where metal nitride particles are left on a semiconductor processing surface includes chemical mechanical polishing (CMP). Frequently in semiconductor processing steps, following RIE etching and backfilling with metal of vias and trench lines, a CMP process is performed to planarize the semiconductor surface, frequently removing not only metal but a portion of the metal nitride etch stop layer overlying the insulating layer. As such, both metal particles and metal nitride particles must be removed from the semiconductor surface before forming the next series of device layers.

At least two major difficulties are presented in using hydrogen peroxide based cleaning solutions of the prior art, such as SC-1 and SC-2, to clean metal nitride surfaces. One difficulty is that both basic and acidic versions of hydrogen peroxide based solutions may tend to attack the metal nitride surface resulting in micro roughness due to oxidation and etching of the surface thereby unacceptably degrading electrical properties in many emerging applications of metal nitrides, for example, as gate materials in CMOS gate structures.

Another difficulty is due to what are believed to be electrical repulsion effects or electrical double layer effects resulting from smaller metal nitride particles, making the electrical repulsion effect from, for example, cleaning solutions SC-1 or SC-2, less effective with metal nitride particles.

There is therefore a need in the semiconductor processing art to develop cleaning methods that are able to effectively clean metal nitride particle residues from semiconductor wafer surfaces without creating a micro roughened metal nitride surface.

It is therefore an object of the invention to provide a cleaning method that will effectively clean metal nitride particle residues from semiconductor wafer surfaces creating a micro roughened metal nitride surface while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method of removing residual contamination including metal nitride particles from semiconductor wafer surfaces.

In a first embodiment according to the present invention, includes the steps of: providing at least one semiconductor wafer with metal nitride particles adhering to the at least one semiconductor wafer surface thereto; subjecting the at least one semiconductor wafer to at least one mechanical brushing process while a cleaning solution including a carboxylic acid is supplied to the at least one semiconductor wafer surface; and, subjecting the at least one semiconductor wafer to an a sonic cleaning process including the carboxylic acid cleaning solution.

In related embodiments, the cleaning solution includes at least one of formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid. Further, the cleaning solution comprises from about 2 to about 10 weight percent carboxylic acid. Further yet the cleaning solution has a temperature of from about 20° C. to about 90° C.

In other related embodiments, the metal nitride particle source includes at least one of a chemical vapor deposition process, a plasma etching process, a chemical mechanical polishing process, and an ion implantation process. Further, the metal nitride includes at least one of silicon nitride, silicon oxynitride, titanium nitride, and tantalum nitride.

In yet other related embodiments, the mechanical brushing process includes using brushes that comprise polyvinylacetal (PVA) bristles. Further, the mechanical brushing process includes at least one rotary brush applied to the at least one semiconductor surface. Further yet, the sonic cleaning process comprises a megasonic cleaning process. Further, the method according to the present invention includes immersing the at least one semiconductor wafer in the carboxylic acid cleaning solution such that the at least semiconductor wafer surface is oriented parallel to an ultrasonic energy source.

In another embodiment the step of subjecting the at least one semiconductor wafer to a sonic cleaning process is performed prior to the step of subjecting the at least one semiconductor wafer to a mechanical brushing process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method according to the present invention is more clearly described by referring to FIGS. 1A–1C, FIGS. 2A–2C, and FIGS. 3A–3C.

In the method according to the present invention the method is explained by an exemplary reference to manufacturing a dual damascene structure where metal nitride layers are advantageously used. It will be appreciated, however, that the method according to the present invention may be used in any semiconductor wafer cleaning process where metal nitride particles are advantageously be removed.

In a typical damascene process, for example, a dual damascene manufacturing process known in the art as a via-first-trench last process, conventional photolithographic processes using a photoresist layer is first used to expose and pattern a metal nitride etching mask overlying an insulating (IMD/ILD) layer, for etching via openings through the insulating layer. Subsequently a similar process is used to define trench openings that are formed substantially over the via openings which in turn define metallic interconnect lines. The via openings and trench openings are subsequently filled with metal to form metallization vias and metal interconnect lines. The surface may then be planarized by conventional techniques to better define the metal interconnect lines and prepare the substrate for further processing.

Figure 1A:
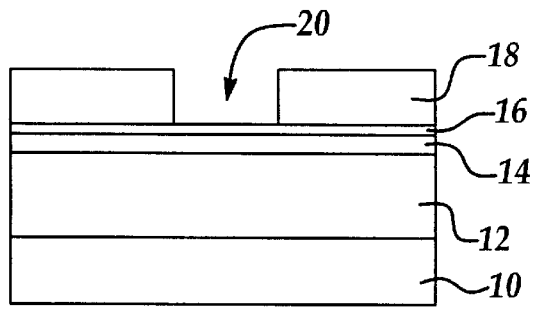
FIGS. 1A–1C are representative cross sectional side views of a portion of a dual damascene structure at different stages of manufacture.

As an example of a typical damascene process, for example, a via-first process, referring to FIG. 1A a substrate having a first conductive layer 10, for example copper or aluminum is provided. Next, an insulating layer 12 is formed over the substrate by, for example, plasma enhanced chemical vapor deposition (PECVD) followed by planarization so that the insulating layer thickness matches the depth of the desired via openings. Thereafter, a metal nitride etching stop layer 14 of, for example, silicon nitride or silicon oxynitride, is formed over the insulating layer by a conventional CVD process such as low pressure CVD (LPCVD), PECVD, or high density plasma CVD (HDPCVD). Following the deposition of the metal nitride etching stop layer, the semiconductor wafer may be subjected to a wafer cleaning process to remove contaminants including residual metal nitride particles remaining on the semiconductor wafer surface.

Figure 1B:
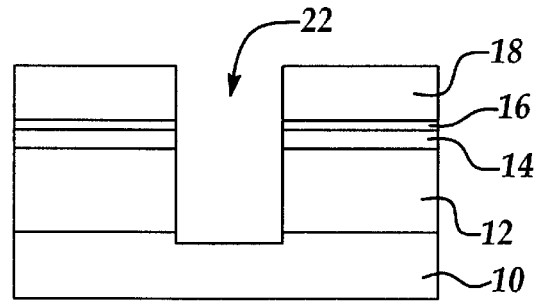

Next, a dielectric anti-reflectance coating (DARC) layer 16, for example, silicon oxynitride or titanium nitride, is formed over the etching stop layer 14 to reduce undesired light reflections from the surface and underlying interfaces in a subsequent photolithographic process. Again, the semiconductor wafer may be subjected to a wafer cleaning process at this point to remove contaminants including residual metal nitride particles. Next, a photoresist layer 18 is formed over the DARC layer, which is subsequently patterned for reactive ion etching (RIE) through the metal nitride layers at e.g., opening 20 to form a via opening through the metal nitride layers and insulating layer. The patterned photoresist layer 18 is then used as a mask to anisotropically etch through the underlying layers 16, 14 to include etching through the insulating layer 12 to conductive layer 10 to form via opening 22 as shown in FIG. 1B. Again, the semiconductor wafer at this point is advantageously subjected to a wafer cleaning process to remove contaminants including residual metal nitride particles remaining on the semiconductor surface or within the etched features from the etching process.

Figure 1C:
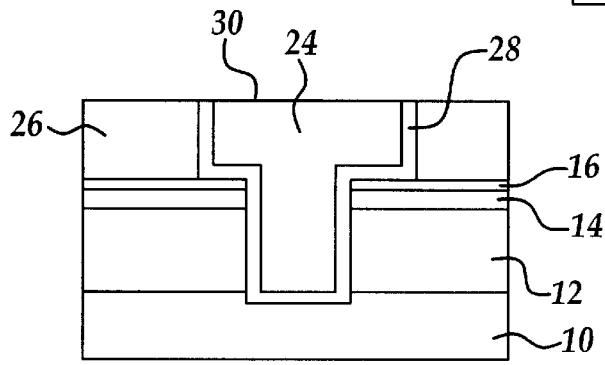

After etching the via opening 22, the photoresist layer 18 is stripped and the process is repeated to form a trench line 24 in insulating layer 26 overlying via opening 22 as shown in FIG. 1C. Referring to FIG. 1C, a metal nitride barrier layer 28, for example, silicon nitride or titanium nitride, may be advantageously deposited by a conventional CVD process, for example, LPCVD, to cover the via walls and via floor to prevent diffusion of subsequently deposited metal filling the via opening 22 and trench opening 24 into the insulting layers 10 and 26. Again, a wafer cleaning process may be advantageously used to remove residual metal nitride particles remaining from the metal nitride CVD process to deposit the metal nitride layer 28. Subsequently the via and trench openings are filled to form vias and trench lines (metal interconnects) followed by a chemical mechanical polishing (CMP) step to planarize the semiconductor surface 30, removing excess metal including a portion of uppermost metal nitride layers, which is again followed by a wafer cleaning process.

In the wafer cleaning process according to the present invention, it has been found that carboxylic acids may be advantageously used in a wafer cleaning process to remove metal nitride particles from a semiconductor wafer surface. In one embodiment, a carboxylic acid solution of between about 2 to about 10 weight percent carboxylic acid is advantageously used according to the present invention. More preferably, the carboxylic acid solution is about 4% by weight. The solution preferably includes deionized water as a solvent.

Figure 2A:
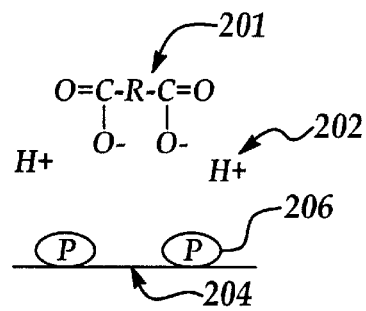
FIGS. 2A–2C are graphical representations of a carboxylic acid cleaning process according to the present invention.
Figure 2B:
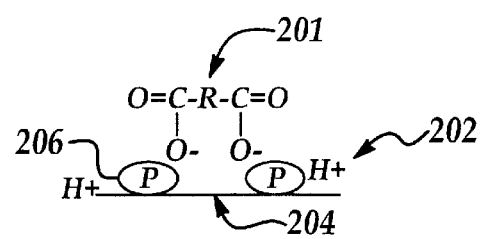
Figure 2C:
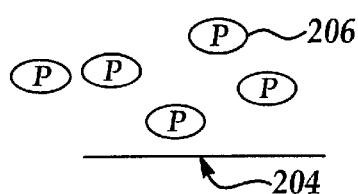

Referring FIG. 2A, in one embodiment according to the present invention, the semiconductor wafer is immersed in the carboxylic acid solution of the present invention together with a source of agitation, such as mechanical brushing or ultrasonic energy. In FIG. 2A a carboxylic acid molecule 201 releases hydrogen ions 202 to form a carboxylate anion group. The weakly acidic solution is believed to alter the surface charge state of the semiconductor wafer surface 204 thereby weakening the adherence of metal nitride particles e.g., 206. While it is believed alteration of the charge state of the semiconductor surface 204 is not sufficient by itself to repel adhering metal nitride particles e.g., 206, it is believed the negatively charged carboxylate anions are able to weakly complex with the metal nitride particles at the surface e.g., 206 as shown in FIG. 2B. As a result of electrostatic repulsion effects and complexing effects it is believed that the metal nitride particles adherence to the wafer surface is weakened, thereby allowing a sufficient agitation applied to the wafer surface by, for example, mechanical brushing and sonic energy to dislodge the particles from the surface. It is believed the particles e.g., 206, after dislodging, as shown in FIG. 2C are thereafter kept from re-depositing on the semiconductor wafer surface 204 by electrostatic repulsion forces. In order to perform the complexing function, the cleaning solution must have at least one carboxylate group. It is believed weak complexes are formed between the metal nitride and carboxylate anions through hydrogen bonding mechanisms. Exemplary acids carboxylic acids include formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, adipic acid, and combinations thereof. Preferably, however, a carboxylic acid such as citric acid, which contains more than one carboxylic acid group is preferred as it is believed the complexing function is improved thereby. Preferably the cleaning solution according to the present invention is within a temperature range of from about 20° C. to about 90° C.

It has been found according to the present invention that using a carboxylic acid, for example, a citric acid cleaning solution, that a mechanical brushing (scrubbing) process alone is insufficient to remove metal nitride particles from the semiconductor wafer surface. In addition, the use of sonic energy, such as a megasonic cleaning process, is likewise by itself insufficient to dislodge the metal nitride particles from a semiconductor wafer surface. It has been unexpectedly found, however, that a mechanical brushing cleaning procedure in addition to a megasonic cleaning procedure using the carboxylic acid solution of the present invention act together synergistically to increase the removal of metal nitride particles compared to either mechanical brushing or megasonic cleaning alone. For example, the mechanical brushing procedure in addition to a megasonic procedure using a carboxylic acid solution of the present invention significantly increases the removal of metal nitride particles from about 82 percent, using cleaning solutions of the prior art including ammonium hydroxide containing solutions, to about 95.8 percent using the carboxylic acid solution of the present invention. The mechanical brushing procedure is preferably carried out prior to the sonic cleaning procedure, but the present invention may additionally be practiced by carrying out the sonic cleaning procedure prior to the mechanical brushing procedure, or by carrying out the sonic, for example megasonic, and the mechanical brushing procedure simultaneously.

Preferably, a conventional sonic cleaning procedure referred to as a megasonic cleaning process is used as the sonic cleaning process which includes a transducer producing sonic energy at a frequency of about 850 to 900 kHz. The sonic energy is preferably directed parallel to the semiconductor wafer surfaces. In operation, referring to FIG. 3A, semiconductor wafer surfaces e.g., 302 held in cassette 303, are immersed in carboxylic acid cleaning solution 304 such that semiconductor wafer surfaces e.g., 302 are oriented parallel to the direction of travel of the sonic waves e.g., 306 produced by the transducer 308, typically mounted against the outside of a cleaning solution container 310. Fresh cleaning solution including one or more carboxylic acids, may be added at the top portion of container 310 through solution supply feeds e.g., 312. Both automated megasonic cleaning devices and automated mechanical brushing devices are commercially available and exemplary apparatus are outlined, for example, in U.S. Pat. No. 5,762,084 by Kreuss et al. which is incorporated herein by reference. It will be appreciated, however, that any conventional mechanical brushing device and megasonic cleaning device may be utilized according to the present invention. Preferably, the mechanical brushing cleaning procedure and the megasonic cleaning procedure according to the present invention, are performed either separately or together, and are each carried out for a period of from about 30 to 120 seconds and more preferably about 45 seconds, but the time period may vary depending on the mechanical brushing procedure used and the megasonic cleaning procedure used.

According to the present invention, the mechanical brushing procedure may be applied to one or both of the semiconductor surfaces, but preferably is applied to both surfaces. The mechanical brushing may be applied by any conventional brush equipped with bristles that will not damage the surface such as a plastic material including, for example, a porous polyvinyl acetal (PVA). Preferably the PVA bristles have a porosity of from about 85 percent to about 95 percent. However, other materials such as nylon, mohair or a polishing pad material can be used. Suitable pressures applied by the brushes to the wafer surface may be within n a range of 1 PSI to about 10 PSI, but are preferably about 5 PSI.

Figure 3A:
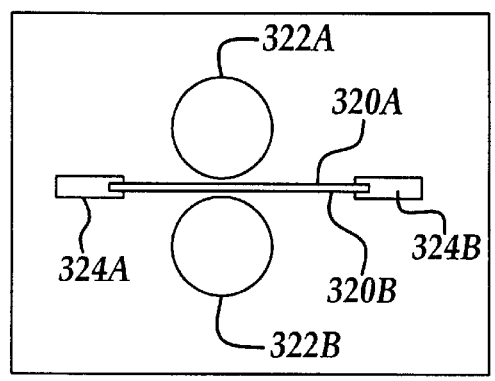
FIGS. 3A–3C are graphical representations of mechanical brushing and megasonic cleaning processes used according to the present invention.
Figure 3B:
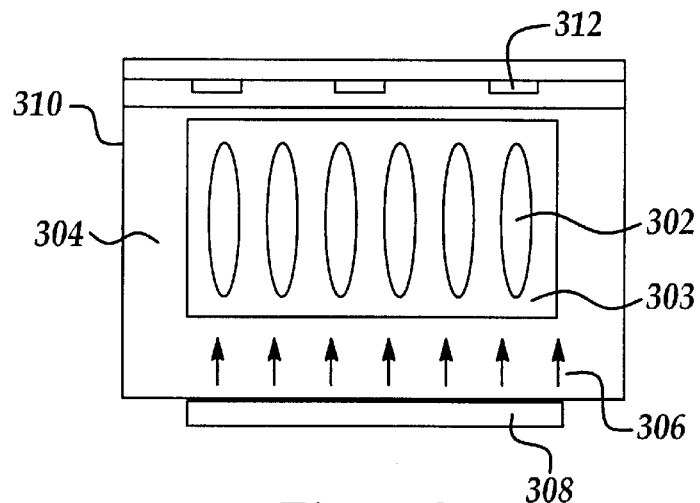
Figure 3C:
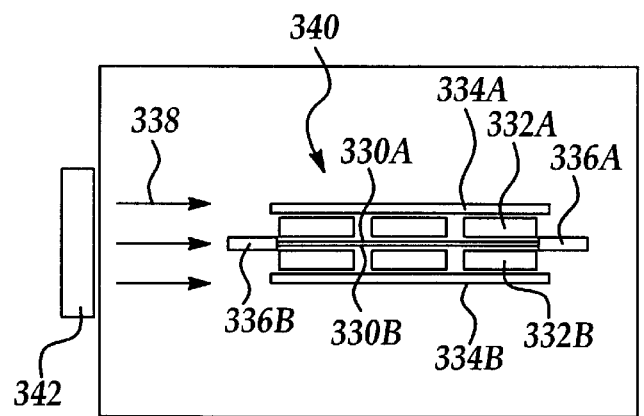

The mechanical brushing action on the semiconductor surface is preferably supplied by a rotary type brush either immersed in the cleaning solution or equipped with commercially available brushes that include a spraying source for the cleaning solution. As shown in FIG. 3B both semiconductor wafer surfaces e.g., 320A and 320B may be contacted with one or more rotary brushes e.g., 322A and 322B while the semiconductor wafer surfaces are, for example, mounted on rollers 324A and 324B with the wafer oriented for example, horizontally, such that both the rotary brush and the semiconductor wafer rotate to allow for the entire wafer surface to be brushed. The wafer may either be immersed in the carboxylic acid containing cleaning solution or have the cleaning solution supplied by cleaning solution feeds located near the wafer surface or included as pat of the brushing fixture. The wafer may further be optionally oriented in other directions such as vertically with rotary brushes contacting the top and bottom surfaces of the wafer while the wafer is rotated. It will be further appreciated that other types of brushing action, such as vertically directed or horizontally directed may be advantageously used according to the present invention.

In another embodiment, the ultrasonic cleaning process and the sonic cleaning process according to the present invention are carried out simultaneously. Preferably the sonic energy source is a megasonic source in the range of 850 kHz to about 900 kHz. For example, the semiconductor wafer surfaces 330A and 330B are contacted by one or more rotary brushes e.g., 332A and 332B mounted on brush holders e.g. 334A and 334B. The semiconductor wafer is mounted on rollers 336A and 336B for rotating the semiconductor wafer while applying rotary brush action. The semiconductor wafer surfaces 330A and 330B are oriented such that they are parallel to the direction of travel e.g., 338 of sonic energy produced waves introduced into cleaning solution 340 by transducer 342 mounted adjacent to container 344.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of removing residual contamination including metal nitride particles from semiconductor wafer surfaces comprising the sequential steps of:

a) mechanically brushing at least one semiconductor wafer surface of a semiconductor wafer while a first carboxylic acid cleaning solution is supplied to the at least one semiconductor wafer surface;

b) transferring the semiconductor wafer from the first carboxylic acid cleaning solution to a second carboxylic acid cleaning solution, each of said first and said second carboxylic acid cleaning solutions being selected from the group consisting of at least one of formic acid, acetic acid, propionic acid, valeric acid, malonic acid, succinic acid, glutaric acid, maleic acid, fumaric acid, phthalic acid, glycolic acid, lactic acid, tartaric acid, gluconic acid, and adipic acid;

c) immersing the semiconductor wafer into the second carboxylic acid cleaning solution, said first and said second carboxylic acid cleaning solutions weakening the adherence of said metal nitride particles to said at least one semiconductor wafer surface; and d) supplying sonic energy to the second carboxylic acid cleaning solution such that the sonic energy is directed parallel to the at least one semiconductor wafer surface, wherein said steps of brushing and supplying said sonic energy to the semiconductor wafer remove said metal nitride particles from said at least one semiconductor wafer surface.

2. The method of claim 1, wherein the first and second carboxylic acid cleaning solutions comprise solutions of from about 2 to about 10 weight percent carboxylic acid.

3. The method of claim 1, wherein the first and second carboxylic acid cleaning solutions have a temperature of from about 20° C. to about 90° C.

4. The method of claim 1, wherein the step of mechanically brushing includes using brushes that comprise polyvinylacetal (PVA) bristles.

5. The method of claim 1, wherein the step of mechanically brushing includes at least one rotary brush applied to the at least one semiconductor wafer surface.

6. The method of claim 1, wherein a sonic energy source supplies sonic energy at a frequency of about 850 kHz to about 900 kHz.

7. The method of claim 5, wherein the step of mechanically brushing includes rotating the at least one semiconductor wafer surface.

* * * * *